Figure 1:
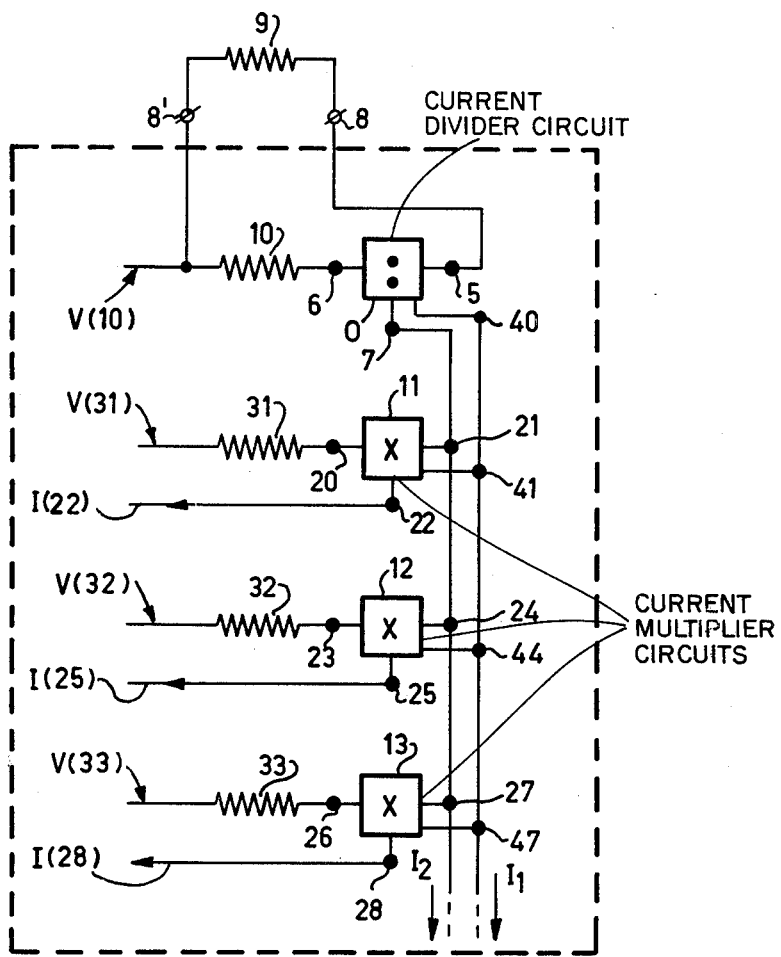

United States Patent [19]

Voorman

[11] 4,017,750
[45] Apr. 12, 1977

[54] CIRCUIT ARRANGEMENT FOR EFFECTIVELY MAKING INTEGRATED IMPEDANCES ACCURATE

[75] Inventor: Johannes Otto Voorman, Eindhoven, Netherlands

[73] Assignee: U.S. Philips Corporation, New York, N.Y.

[22] Filed: Apr. 8, 1976

[21] Appl. No.: 675,176

Related U.S. Application Data

[63] Continuation of Ser. No. 507,367, Sept. 18, 1974, abandoned.

[52] U.S. Cl. .............................. 307/303; 307/229; 307/296 R 3n
[51] Int. Cl.² .................. H03K 3/26; H03K 23/08; H03K 1/00
[58] Field of Search .......... 307/229, 296, 297, 303; 357/51

[56] References Cited

UNITED STATES PATENTS

| | | | |
|---|---|---|---|
| 3,500,032 | 3/1970 | Buckley et al. | 307/303 |
| 3,617,778 | 11/1971 | Korom | 307/303 |
| 3,688,132 | 8/1972 | Gill et al. | 357/51 |
| 3,697,784 | 10/1972 | Moulding | 357/51 |

Primary Examiner—Stanley D. Miller, Jr.
Attorney, Agent, or Firm—Frank R. Trifari; Ronald L. Drumheller

[57] ABSTRACT

A circuit arrangement for effectively correcting the absolute values of a plurality of impedances when they already have impedance values in the correct ratio to each other. Current going through each impedance is multiplied by a ratio derived from a precision impedance. The circuit is particularly useful in integrated circuit technology where impedance ratios can be accurately controlled but not so readily the absolute values of the impedances.

6 Claims, 4 Drawing Figures

CIRCUIT ARRANGEMENT FOR EFFECTIVELY MAKING INTEGRATED IMPEDANCES ACCURATE

This is a continuation of application Ser. No. 507,367, filed Sept. 18, 1974, now abandoned.

The invention relates to an integrated circuit which includes a plurality of similar impedances.

As is known, it is difficult to manufacture accurate resistors and capacitors by integrated-circuit techniques. Moreover, the values of resistors and capacitors in integrated-circuit form greatly vary with temperature. The difference of the values of integrated-circuit resistors from the desired values may readily be 10%. If the temperature of an integrated circuit including such resistors is increased by, say, 30° C, practice shows that the said differences will increase by another 10%, so that the overall differences will be 20%. Consequently, the said integrated-circuit resistors and capacitors are unsuitable for many uses, for example for gyrator resonant circuits. As is known, a gyrator resonant circuit comprises a first gate and a second gate, which each are terminated by a capacitor, a first voltage-controlled current source of positive transconductance and a second voltage-controlled current source of negative transconductance, the input of the said first voltage-controlled current source being connected to the output of the second voltage-controlled current source to form the said first gyrator gate, while the input of the second voltage-controlled current source is connected to the output of the first voltage-controlled current source to form the said second gyrator gate.

As is well known, a gyrator transforms the gyrator connected to its output gate into a synthetic inductor which together with the capacitor connected to the gyrator input gate constitutes the resonant circuit. The gyrator has the known property that in principle the value of the synthetic inductor can simply be varied by varying the gyrator constant, which means that a change in tuning and/or a change in the transmission curve can simply be effected by varying the settings of variable resistors. It will be clear that it is not possible to realize accurate gyrator resonant circuits in the form of integrated circuits by means of the abovedescribed inaccurate integrated-circuit resistors.

A possible solution of the above problem is obtainable by using discrete components for all the gyrator resistors. However, this has the disadvantage that the number of connecting parts of the integrated circuit is unnecessarily increased. Similar problems arise in RC filters and phase shifters.

It is an object of the present invention to provide another solution of the abovedescribed problem, and the invention is characterized in that at least some of the similar impedances are each assigned a current multiplier which has a first, a second and a third input and an output, each impedance being connected to the first input of the associated current multiplier, the second inputs of the current multipliers being jointly coupled to a first output of a current divider circuit while the third inputs of the current multipliers are jointly connected to a second output of the current divider circuit; which current divider circuit has two inputs, a similar impedance being connected between one input of the current divider circuit and a first connecting point while the other input of the current divider circuit is connected to a second connecting point, means being provided to connect an external precision resistor between the said first and second connecting points.

Figure 2:
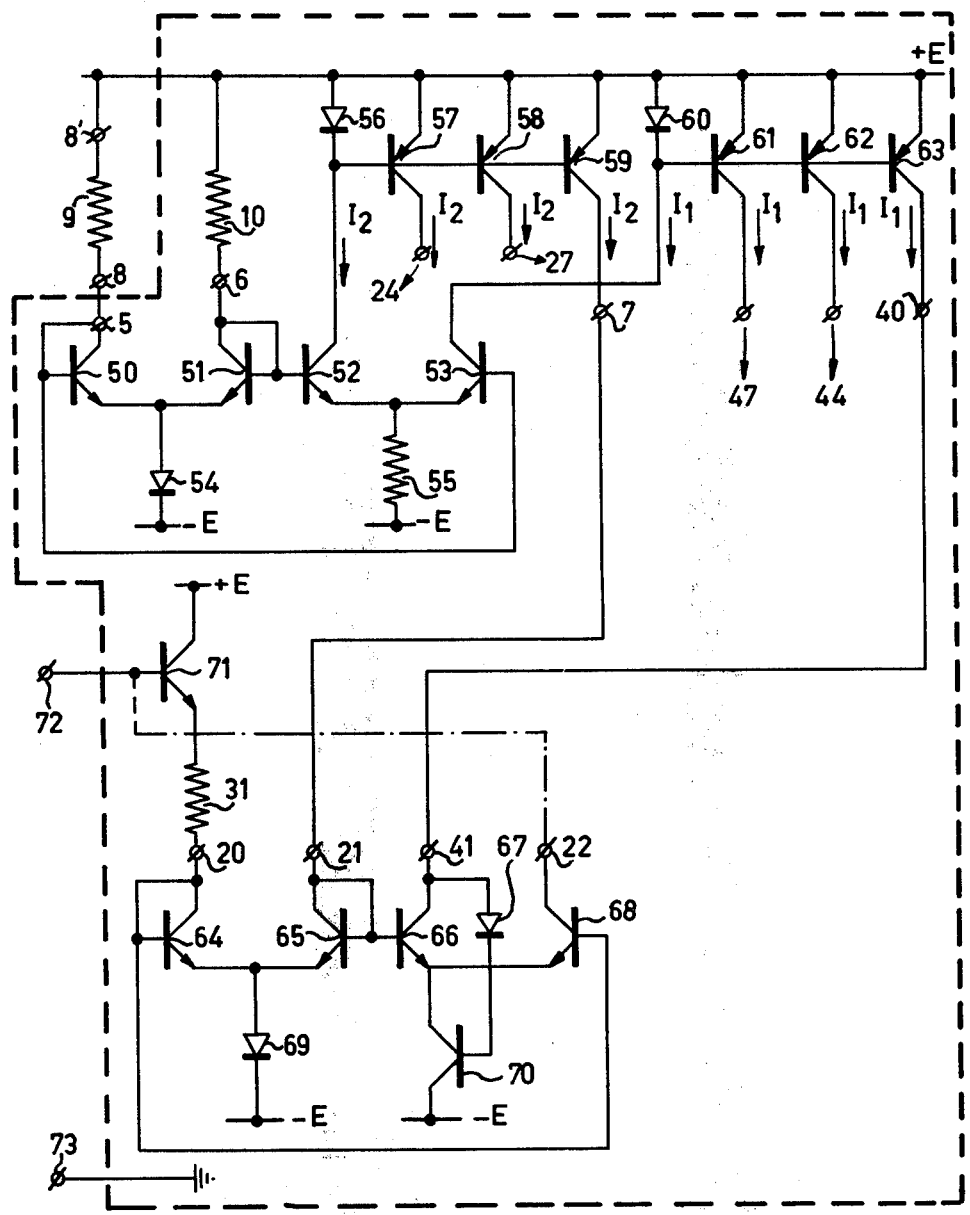
Figure 3:
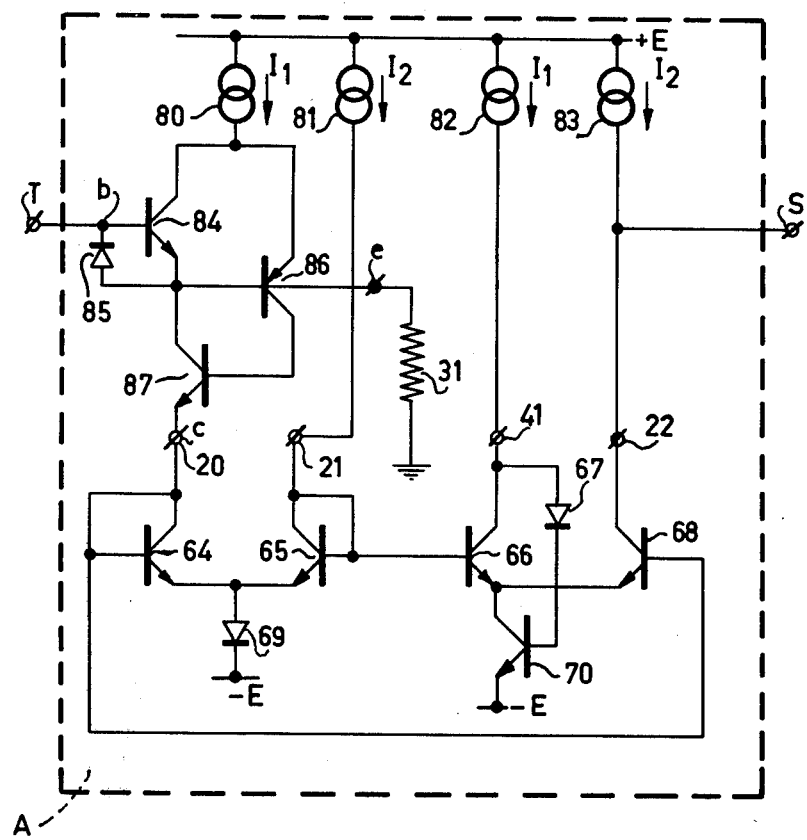
Figure 4:
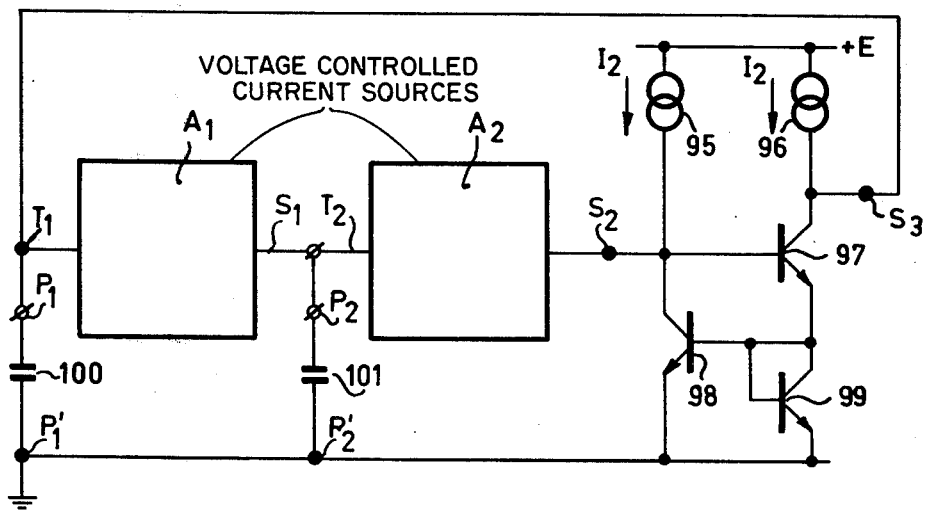

Embodiments of the invention will now be described, by way of example, with reference to the accompanying diagrammatic drawings, in which:

FIG. 1 is a circuit diagram showing schematically the basic elements of a circuit according to the invention, FIG. 2 shows a first embodiment of the invention, FIG. 3 shows a second embodiment of the invention, and FIG. 4 shows a gyrator resonant circuit in which the steps according to the invention are used.

The part of the circuit arrangement of FIG. 1 which is enclosed by a broken line is made in integrated-circuit form in a semiconductor body in known manner. The similar impedances are constituted by resistors 10, 31, 32 and 33. The similar impedances 31, 32 and 33 have current multipliers 11, 12 and 13 respectively assigned to them. The resistor 31 is connected to a first input 20 of the current multiplier 11, which has an output 22. The resistor 32 is connected to a first input 23 of the current multiplier 12, which has an output 25. The resistor 33 is connected to a first input 26 of the current multiplier 13, which has an output 28. The current multipliers 11, 12 and 13 have second inputs 21, 24 and 27 respectively and third inputs 41, 44 and 47 respectively. The second inputs of the current multipliers 11, 12 and 13 are jointly connected to a first output 7 of a current divider circuit 0, and the third inputs of the current multipliers 11, 12 and 13 are jointly connected to a second output 40 of the current divider circuit 0. The resistor 10 is connected between a first input 6 of the current divider circuit 0 and a first connecting point 8'. A second input 5 of the current divider circuit 0 is connected to a second connecting point 8. A precision resistor 9 is connected between the first connecting point 8' and the second connecting point 8.

As is known, monolithic integrated transistors enable accurate multiplications and divisions to be performed. For this purpose use is made of the transistor relation:

$$V_{BE} = \frac{KT}{q} \cdot \ln \frac{I}{U_s} \qquad (1)$$

where $V_{BE}$ = the base emitter voltage of the transistor
$I$ = the collector current of the transistor
$I_s$ = the saturation current of the transistor
$k$ = Boltzmann's constant
$T$ = absolute temperature
$q$ = charge on the electron.

Addition and subtraction of base emitter voltages of identical transistors means multiplication and division respectively of their collecting currents. As will be set out more fully hereinafter, the current divider circuit 0 satisfies the following relation:

$$\frac{R(\text{in})}{R(\text{out})} = \frac{I_1}{I_2} \qquad (2)$$

where R(in) is the resistance of the resistor 10 and R(out) is the resistance of the external precision resistor 9. The current multipliers satisfy the following relation:

$$I(n) = \frac{V(k)}{R(k)} \cdot \frac{I_1}{I_2} \qquad (3)$$

where $n = 22, 25, 28$ and $k = 31, 32, 33$, $I(n)$ is the output current of the relevant current multiplier 11, 12 or 13, $R(k)$ is the resistance of the relevant integrated resistor 31, 32 or 33, and $V(k)$ is the voltage across the relevant integrated resistor. Substitution of relation (2) in relation (3) yields $$I(n) = \frac{V(k)}{R(\text{out})} \cdot \frac{R(\text{in})}{R(k)} \qquad (4)$$

From relation (4) it follows that $$\frac{V(k)}{I(n)} = R(\text{out}) \cdot \frac{R(k)}{R(\text{in})} \qquad (5)$$

Relation (5) indicates that the voltage $V(k)$ and the current $I(n)$ are in a ratio equal to the product of the resistance of the external precision resistor 9 and the factor $R(k)/R(\text{in})$. The latter factor is the quotient of two integrated resistors. As is known, the mutual (relative) accuracy of integrated resistors is very high. Hence the accuracy of the said ratio $V(k)/I(n)$ and its variations due to temperature fluctuations will mainly be determined by the accuracy and the temperature coefficient of the external precision resistor 9. The steps according to the invention ensure that highly accurate voltage-current conversions (4) are obtainable in an integrated circuit by means of a single external precision resistor. This requires only two connecting points 8 and 8' on a chip. Thus a 7th order integrated gyrator lowpass telephony filter is obtainable which requires only 12 external connecting points instead of the 23 external connecting points required when the steps according to the invention are not used.

In the embodiment shown in FIG. 2 a current divider circuit comprises a first transistor 50, a second transistor 51, a third transistor 52 and a fourth transistor 53. The emitters of the transistors 50 and 51 are connected through a diode 54 to a point of constant potential, and the emitters of the transistors 52 and 53 are connected through a resistor 55 to a point of constant potential. The collector and the base of the transistor 51 are connected to the base of the transistor 52, and the base of the transistor 53 is connected to the junction point of the base and the collector of the transistor 50. The collector 5 of the transistor 50, which also forms the first input of the current divider circuit, is connected to a connecting point 8. An external precision resistor 9 is connected between this point and the connecting point 8'. The collector 6 of the transistor 51 forms the second input of the current divider circuit and is connected through the resistor 10 to a point of constant potential. The collector of the transistor 52 is coupled to the first output 7 of the current divider circuit by means of a diode 56 and a transistor 59. For this purpose the collector of the transistor 52 is connected through the diode 56 to a point of constant potential while this diode is shunted by the base emitter diode of the transistor 59 the collector of which is connected to the first output 7 of the current divider circuit. The base emitter diodes of transistors 57 and 58 also are connected in parallel with the diode 56. The collector of the transistor 53 is coupled to the second output 40 of the current divider circuit by means of a diode 60 and a transistor 63. For this purpose the collector of the transistor 53 is connected to a point of constant potential through the diode 60 which is shunted by the base emitter diode of the transistor 63 the collector of which is connected to the first input 40 of the current divider circuit. The base emitter diodes of transistors 61 and 62 also are connected in parallel with the diode 60.

In the embodiment of FIG. 2 a single current multiplier is used. This current multiplier is associated with the integrated resistor 31 which is included in the emitter lead of a transistor 71 connected as an emitter follower. The said current multiplier comprises a first transistor 64, a second transistor 63, a third transistor 66 and a fourth transistor 68. The emitters of the first transistor 64 and the second transistor 65 are interconnected, as are the emitters of the third transistor 66 and the fourth transistor 68. The bases of the transistors 65 and 66 are interconnected, as are the bases of the transistors 64 and 68. The collector of the transistor 64 is connected to the base of this transistor and forms the first input 20 of the current multiplier. The collector of the transistor 65 is connected to the base of this transistor and forms the second input 21 of the current multiplier. The collector of the transistor 66 forms the third input 41 of the current multiplier. The collector of the transistor 68 forms the output 22 of the current multiplier. The emitters of the transistors 64 and 65 are connected via a diode 69 to a point of constant potential. The emitters of the transistors 66 and 68 are connected to a point of constant potential via the collector emitter path of an auxiliary transistor 70. The base of the auxiliary transistor 70 is connected through a diode 67 to the collector of the transistor 66. The second input 21 of the current multiplier is connected to the first input 7 of the current divider circuit, and the third output 41 of the current multiplier is connected to the second output 40 of the current divider circuit. The first input 20 of the current multiplier is connected to one terminal of the resistor 31 the other terminal of which is connected to the emitter of the transistor 71.

The following equation applies to the current amplifier used in the circuit arrangement of FIG. 2:

$$V_{BE}(64) - V_{BE}(65) + V_{BE}(66) = V_{BE}(68) = 0 \qquad (6)$$

where $V_{BE}(i)$, $i = 64, 65, 66$ and 68, is the base emitter voltage of the transistors 64, 65, 66 and 68 respectively. The relation (1) applies to all the said base emitter voltages, so that $$O = \frac{kT}{q}\left( \ln \frac{V - V_d}{R(31) \cdot I_s} - \ln \frac{I_2}{I_s} + \ln \frac{I_1}{I_s} - \ln \frac{i_o}{I_s} \right) \qquad (7)$$

where
$V =$ the voltage at the base of the transistor 71,
$R(31) =$ the resistance of the resistor 31,
$i_o =$ the output current of the multiplier at 22,
$I_2 =$ collector current of transistor 65,
$I_1 =$ collector current of transistor 66,
$V_d =$ the sum of the voltages across the base emitter diodes of the transistors 71 and 64 and across the diode 69.

With respect to the output current $i_o$ of the current multiplier the following relation follows from (7):

$$i_o = \frac{V - V_d}{R(31)} \cdot \frac{I_1}{I_2} \quad (8)$$

Because the structure of the current divider circuit comprising the transistors 50, 51, 52 and 53 is the same as that of the current multiplier comprising the transistors 64, 65, 66 and 68, we have for the said current divider circuit:

$$I_1 = \frac{E - V_d}{R(\text{out})} \cdot \frac{R(\text{in})}{E - V_d} \cdot I_2 \quad (9)$$

where
$E - V_d =$ the voltage across the resistors 9 and 10,
$V_d =$ the sum of the voltage across the base emitter diode of the transistor 50 and the diode 54 and the sum of the voltages across the base emitter diode of the transistor 51 and the diode 54,
$R(in) =$ the resistance of the resistor 10,
$R(out) =$ the resistance of the resistor 9,
$I_2 =$ the collector current of the transistor 52
$I_1 =$ the collector current of the transistor 53.
From the relation (9) follows the relation:

$$\frac{I_1}{I_2} = \frac{R(\text{in})}{R(\text{out})} \quad \begin{matrix}(10)\\ \text{see}\\ (2)\end{matrix}$$

combining (8) and (10) yields the relations $$i_o = \frac{V - V_d}{R(\text{out})} \cdot \frac{R(\text{in})}{R(31)} \quad \begin{matrix}(11)\\ \text{see}\\ (4)\end{matrix}$$

$$\frac{V - V_d}{i_o} = R(\text{out}) \cdot \frac{R(31)}{R(\text{in})} \quad \begin{matrix}(12)\\ \text{see}\\ (5)\end{matrix}$$

The relation 12 shows that the voltage $(V - V_d)$ and the current $i_o$ are in a ratio equal to the product of the resistance of the external precision resistor 9 and the factor $R(31)/R(in)$. The latter factor is the quotient of two integrated resistors. As is known, the mutual (relative) accuracy of integrated resistors is very high. Hence the accuracy of the said ratio $(V - V_d)/i_o$ and its variations due to the temperature fluctuations will mainly be determined by the accuracy and the temperature coefficient of the external precision resistor 9.

If the steps according to the invention were not taken, i.e. if the current divider circuit and the current multiplier circuit were omitted, the voltage $(V-V_d)$ and the output current $i$ of the transistor 71 connected as an emitter follower would be in the ratio:

$$\frac{V - V_d}{i} = R(31) \quad (13)$$

where
$V =$ the voltage at the base of the transistor 71.
$V_d =$ the base emitter voltage of the transistor 71,
$i =$ the emitter current of the transistor 71.
The relation (13) clearly shows that the said ratio now is determined by the absolute accuracy of the integrated resistor 31, which is poor, as has been mentioned hereinbefore. Hence, the voltage-to-current conversion obtained by means of the transistor 71 connected as an emitter follower will be inaccurate.

In the embodiment shown in FIG. 2 the step according to the invention is applied to a single integrated resistor 31. It will be appreciated that the step may be applied to a plurality of integrated resistors, as is indicated schematically in FIG. 1. The current divider circuit is common to all the integrated resistors. The second inputs 24 and 27 of the current multipliers 12 and 13 respectively are coupled to the current divider circuit by means of transistors 57 and 58 respectively, as is shown in FIG. 2. The third inputs 44 and 47 of the current multipliers 12 and 13 respectively are coupled to the current divider circuit by means of transistors 61 and 62 respectively, as is shown in FIG. 2. If in the circuit of FIG. 2 the output 22 of the current multiplier is connected to the base of the transistor 71, there will be seen between the base 72 of the transistor 71 and a point of constant potential, for example the point 73, a resistor which has an accuracy and a temperature coefficient which are equal to the accuracy and the temperature coefficient of the external precision resistor 9.

FIG. 3 shows a second embodiment of the invention in which in order to achieve accurate voltage-to-current conversion an equivalent transistor is used. The equivalent transistor comprises transistors 84, 86 and 87, a diode 85 and a current source 80. A point $b$ is the base of this equivalent transistor, a point $e$ is the emitter and a point $c$ is the collector. The collector of the transistor 84 is connected to the emitter of the transistor 86 and through the high-resistance current source 80 to a point of constant potential. The emitter of the transistor 84 is connected to the base of the transistor 86 and through the diode 85 to the base of the transistor 84. The emitter of the transistor 84 is further connected via the collector-emitter path of the transistor 87 to the input 20 of the current multiplier comprising the transistors 64, 65, 66, 68 and 70 and the diodes 67 and 69. The said current multiplier is of the same type as the current multiplier described with reference to the embodiment of FIG. 2. The emitter $e$ of the equivalent transistor is connected to a point of constant potential through the resistor 31. In the embodiment of FIG. 3 the current divider circuit is omitted for the sake of clarity. In the embodiment shown in FIG. 3 the currents $I_1$ and $I_2$ are produced in a manner corresponding to that described with reference to the embodiment of FIG. 2 (see transistors 57, 58, 59 and 60, 61, 63). A current source 83 of FIG. 3 corresponds to the transistor 63 of FIG. 2, a current source 81 corresponds to the transistor 59 of FIG. 2, and so on. The aforementioned equivalent transistor has the advantage of ensuring highly accurate voltage-to-current conversion which is substantially independent of the transistor parameters, as is explained in detail in our prior Netherlands Patent Application No. 7,102,199 (PHN. 5420), British Patent Specification No. 1,317,869). The operation of the embodiment shown in FIG. 3 is equal to that of the embodiment of FIG. 2, with the difference that the transistor 71 of FIG. 2 is replaced by the above-mentioned equivalent transistor. This means that in the relation (12) the term $V_d$ is equal to the base emitter voltage of the transistor 84. The device A, i.e. the portion of FIG. 3 surrounded by dotted lines, may be regarded as an accurate voltage-controlled current source having an input T and an output S. By means of such voltage-controlled current sources gyrators can be realized, as is shown in FIG. 4.

The gyrator shown in FIG. 4 has a first gate $p_1 - p_1'$ and a second gate $p_2 - p_2'$. The first gate is terminated by a capacitor 100, and the second gate is terminated by a capacitor 101. A gyrator fundamentally comprises two anti-parallel connected stages of positive transconductance $G_1$ and negative transconductance $G_2$ respectively. Each stage is assumed to perform accurate conversion of a voltage into a current. Thus the gyrator transforms the capacitor 101 connected to its second gate $p_2 - p_2'$ into a synthetic inductor:

$$l_{EQ} = \frac{C_2}{G_1 \cdot G_2}$$

where $C_2$ is the capacitance of the capacitor 101. The said synthetic inductor together with the capacitor 100 connected to the first gate $p_1 - p_1'$ forms a resonant circuit.

The gyrator of FIG. 4 has a first voltage-controlled current source $A_1$, a second voltage-controlled current source $A_2$ and a current inverter comprising transistors 97 and 98 and a diode 99. The two voltage-controlled current sources $A_1$ and $A_2$ have positive transconductance.

The second voltage-controlled current source $A_2$ together with the said current inverter forms a voltage-controlled current source of negative transconductance which has an input $T_2$ and an output $S_3$. The output $S_3$ is connected to the input $T_1$ of the first voltage-controlled current source $A_1$, the output $S_1$ of which is connected to the input $T_2$ of the second voltage-controlled current source $A_2$. The structures and operations of the voltage-controlled current source are equal and correspond to what has been described with reference to FIG. 3. The current inverter comprising the transistors 97 and 98 and the diode 99 is of the type described, for example, in "Digest of Technical Papers, Solid State Circuits Conference", February 1968, page 21, FIG. 5. The currents $I_2$ of the current sources 95 and 96 are obtained by transistor circuits in the manner described with reference to FIG. 1. The base emitter paths of the said transistors are connected in parallel with the diode 56. The function of the said current inverter is to change the sign (to shift the phase by 180°) of the output current of the second voltage-controlled current source $A_2$ so that this source $A_2$ together with the current inverter constitutes a voltage-controlled current source of negative transconductance. For a discussion of the operation of gyrators comprising equivalent transistors we refer to "I.E.E.E. Journal of Solid State Circuits", vol. Sc-7, nr. 6, December 1972, pages 469 to 479.

The resonant frequency of the gyrator resonant circuit of FIG. 4 can simply be varied by varying the ratio between the input and output currents of the current inverter. This may, for example, simply be obtained by making the emitter areas of the transistors 98 and 99 different. A simple calculation shows that the resonant frequency is equal to $$\omega_0 = \frac{1}{RC} \cdot \sqrt{\frac{n_2}{n_1}}$$

where $R =$ the resistance of the gyrator resistor 31 (FIG. 3),
$n_1 =$ emitter area of the transistor 98,
$n_2 =$ emitter area of the transistor 99,
$C =$ capacitance of the capacitors 100 and 101.

Depending upon the relative equality of the transistors the resonant frequency $\omega_0$ can be varied within given limits with a high degree of accuracy.

What is claimed is:

1. A circuit arrangement, comprising:
 a first impedance;
 a plurality of second impedances, said first and plurality of second impedances having accurately predetermined impedance ratios with respect to each other but inaccurately determined absolute impedance values;
 means for electrically connecting one end of said first impedance to a source of constant potential;
 a precision impedance electrically connected at one end thereof to said one end of said first impedance;
 a current divider circuit electrically connected between the other end of said first impedance and the other end of said precision impedance for producing first and second output currents having the same ratio as the impedance ratio between said first impedance and said precision impedance;
 a separate current multiplier circuit corresponding to and electrically connected to each one of said plurality of second impedances, each of said current multiplier circuits being responsive to current flowing through the corresponding electrically connected second impedance and being responsive to said first and second output currents of said current divider circuit for producing a current multiplier output current proportional to the product of said current flowing through the corresponding electrically connected second impedance and the ratio between said first and second output currents of said current divider circuit,
 whereby the values of said current multiplier output currents are accurately determined by said accurately predetermined impedance ratios and the impedance value of said precision impedance and are not substantially affected by the absolute impedance values of said first and plurality of second impedances.

2. A circuit arrangement as defined in claim 1 wherein said current divider circuit comprises first, second, third and fourth transistors, the emitters of said first and second transistors being electrically interconnected, the emitters of said third and fourth transistors being electrically interconnected, the bases of said first and fourth transistors being electrically interconnected, the bases of said second and third transistors being electrically interconnected, said other end of said precision impedance being electrically connected to said interconnected bases of said first and fourth transistors, said other end of said first impedance being electrically connected to said interconnected bases of said second and third transistors, and the collector currents of said third and fourth transistors being respectively said second and first output currents.

3. A circuit arrangement as defined in claim 2 and further comprising a first diode electrically connecting said interconnected emitters of said first and second transistors to a point of constant potential, and a resistance electrically connecting said interconnected emitters of said third and fourth transistors to said point of constant potential.

4. A circuit arrangement as defined in claim 3 further comprising second and third diodes respectively electrically connecting the collectors of said third and fourth transistors to said one end of said first impedance, a first plurality of transistors equal in number to said current multiplier circuits, the base-emitter junctions of said first plurality of transistors being electrically connected in parallel with said second diode, and a second plurality of transistors equal in number to said current multiplier circuits, the base-emitter junctions of said second plurality of transistors being electrically connected in parallel with said third diode.

5. A circuit arrangement as defined in claim 4 wherein each of said current multiplier circuits comprises fifth, sixth, seventh and eighth transistors, the emitters of said fifth and sixth transistors being electrically interconnected, the emitters of said seventh and eighth transistors being electrically interconnected, the bases of said fifth and eighth transistors being electrically interconnected, the bases of said sixth and seventh transistors being electrically interconnected, the collector of said sixth transistor being electrically connected to a collector of one of the transistors of said first plurality of transistors, the collector of said seventh transistor being electrically connected to a collector of one of the transistors of said second plurality of transistors, the collector of said fifth transistor being connected to the corresponding electrically connected second impedance, and the collector current of said eighth transistor being said current multiplier output current.

6. A circuit arrangement as defined in claim 5 and further comprising a fourth diode electrically connecting said interconnected emitters of said fifth and sixth transistors to said point of constant potential, an auxiliary transistor having a collector-emitter path electrically connecting the interconnected emitters of said seventh and eighth transistors to said point of constant potential, and a fifth diode electrically connecting the base of said auxiliary transistor to the collector of said seventh transistor.

* * * * *

UNITED STATES PATENT AND TRADEMARK OFFICE
CERTIFICATE OF CORRECTION

PATENT NO. : 4,017,750
DATED : April 12, 1977
INVENTOR(S) : JOHANNES OTTO VOORMAN It is certified that error appears in the above-identified patent and that said Letters Patent are hereby corrected as shown below:

On the Title Page, after Section [21], insert the following:
--[30] Foreign Application Priority Data Oct. 1, 1973   Netherlands.......7313452--

Column 1, line 13, "difference" should be --differences--

Column 2, line 46, In equation (1), " $\frac{I}{U_s}$ " should be -- $\frac{I}{I_s}$ --

Column 4, line 15, "63" should be --65--

Signed and Sealed this

Twenty-eighth Day of June 1977

[SEAL]

Attest:

RUTH C. MASON
*Attesting Officer*

C. MARSHALL DANN
*Commissioner of Patents and Trademarks*